United States Patent
Baltus

(10) Patent No.: US 6,282,413 B1
(45) Date of Patent: *Aug. 28, 2001

(54) MULTISTAGED FREQUENCY CONVERSION WITH SINGLE LOCAL OSCILLATOR

(75) Inventor: Petrus G. Baltus, Eindhoven (NL)

(73) Assignee: U.S. Philips Corporation, New York, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/035,433

(22) Filed: Mar. 5, 1998

(30) Foreign Application Priority Data

Mar. 12, 1997 (EP) .................................................. 97200739

(51) Int. Cl.⁷ ...................................................... H04B 1/26
(52) U.S. Cl. .......................... 455/260; 455/314; 455/318; 455/323; 455/255
(58) Field of Search .............................. 455/73, 84, 118, 455/255, 257, 258, 259, 260, 302, 303, 304, 313, 314, 315, 316, 318, 323, 324, 296, 310, 317, 86, 256, 254, 319; 331/60

(56) References Cited

U.S. PATENT DOCUMENTS

| | | | |
|---|---|---|---|
| 4,246,539 | * | 1/1981 | Haruki et al. ........................... 455/76 |
| 4,580,289 | * | 4/1986 | Enderby ............................... 455/314 |
| 5,179,729 | * | 1/1993 | Mishima et al. ...................... 455/260 |
| 5,263,197 | * | 11/1993 | Manjo et al. ......................... 455/324 |
| 5,519,885 | * | 5/1996 | Vaisanen .............................. 455/76 |
| 5,530,929 | * | 6/1996 | Lindquist et al. ................... 455/318 |
| 5,606,736 | * | 2/1997 | Hasler et al. ......................... 455/314 |
| 5,654,674 | * | 8/1997 | Matsuno ............................... 455/318 |
| 5,752,169 | * | 5/1998 | Hareyama et al. .................... 455/76 |
| 5,761,615 | * | 6/1998 | Jaffee .................................. 455/314 |
| 5,852,784 | * | 12/1998 | Ito et al. .............................. 455/314 |
| 5,937,335 | * | 8/1999 | Park et al. ............................. 455/86 |
| 5,953,643 | * | 9/1999 | Speake et al. ........................ 455/324 |

FOREIGN PATENT DOCUMENTS

| | | | |
|---|---|---|---|
| 3726181A1 | 3/1988 | (DE) | ................................. H04B/1/30 |
| 63175507A | 7/1988 | (JP) | ................................. H03D/7/16 |

OTHER PUBLICATIONS

"High Integration CMOS RF Transceivers", Proc. of the Workshop on Advances in Analog Circuit Design, Apr. 2–3–4, 1996, Lausanne–Ouchy, Switzerland, by F. Brianti et al, 14 pages.

* cited by examiner

Primary Examiner—Lester G. Kincaid

(57) ABSTRACT

A frequency conversion circuit has a first frequency conversion stage with a first mixer, a second conversion stage with a second mixer, an oscillator, a first frequency divider, and a second frequency divider. The first frequency divider is directly connected between the oscillator and an input of the first mixer. The second frequency divider is coupled between the oscillator and an input of the second mixer. The first and second frequency dividers can either be connected in series or parallel.

13 Claims, 3 Drawing Sheets

MULTISTAGED FREQUENCY CONVERSION WITH SINGLE LOCAL OSCILLATOR

BACKGROUND OF THE INVENTION

The present invention relates to a frequency-conversion circuit comprising a multistage frequency-converting means and an oscillator output coupled to at least one oscillator input of the multistage frequency-converting means.

The present invention also relates to a telecommunication system, a receiver, a transmitter, a transceiver, an integrated circuit, and a telephone device provided with such a frequency-conversion circuit.

Such a frequency-conversion circuit is known from "High Integration CMOS RF Transceivers", Proc. of the Workshop on Advances in Analog Circuit Design, Apr. 2–3–4, 1996, Lausanne-Ouchy, Switzerland, by F. Brianti et al., 14 pages. This article describes in particular integrated digital radio architectures having a frequency up or down converting means usable, for example, in low-IF, such as zero-IF, or wideband-IF configurations. By definition, a low-IF configuration, such as a receiver, transmitter or transceiver, is a configuration, wherein the intermediate frequency (IF) is close to zero, or zero in the case of zero-IF. Some known advantages of zero-IF configurations are the high degree of integration on a chip that can be achieved as compared to a heterodyne or conventional IF configuration, because of the possibility to apply filters, such as low-pass filters for channel selectivity, that can be integrated at low cost. Reduced power dissipation, fewer interference problems and better crosstalk control than in a conventional configuration that requires external components can be achieved with a careful design using this zero-IF architecture. The frequency conversion is implemented by means of two stages of mixers (see FIG. 2) resulting in a multistage frequency conversion in order to reduce the requirements imposed upon image rejection filters in front of the mixers as compared to conventional architectures. The mixer stages are quadrature mixer stages each having an I-path and a Q-path in order to properly distinguish between positive and negative frequencies, corresponding to upper and lower sidebands of an input RF signal. These quadrature mixers eliminate an off-chip IF filter function. Each of the two stages is being fed by a separate voltage-controlled oscillator (VCO) phase-locked loop (PLL) synthesizer circuit. Both synthesizer circuits are connected to a common crystal oscillator. The problem of the known frequency conversion circuit is that two synthesizer circuits are needed, which circuits lead to significant costs and require a large surface, area and much power.

OBJECTS AND SUMMARY OF THE INVENTION

It is an object of the present invention to reduce the chip area and power consumption needed for integrated architectures. To achieve this, the frequency-conversion circuit according to the invention is characterised in that the frequency-conversion circuit comprises a frequency-divider means coupled between the oscillator output and at least one further oscillator input of the multistage frequency-converting means. The frequency-conversion circuit according to the invention has the advantage that one VCO/PLL circuit can be dispensed with, thus saving components, cost and chip area, and reducing power dissipation and weight, which is particularly important in mobile communication applications of the frequency-conversion circuit, such as telephone systems. In addition, integration of only one of such VCO/PLL circuit is more easy and only involves a minimum number of components.

In an embodiment of the frequency-conversion circuit according to the invention, the frequency divider means comprises a counter means. Such counter means are very simple to integrate. Furthermore, the counter means provide for an exact relation as a function of time, in particular the phase, between the respective oscillator signals intended for each stage of the multistage frequency-converting means. Because of the inherent phase accuracy between the respective oscillator signals derived from both respective outputs of the counter means, a good image or mirror signal suppression is automatically achieved so that, if necessary at all, a modest image rejection-suppression filter will be sufficient in practise to reveal a high-quality frequency conversion. In general, the counter means already have or can easily be provided with outputs for providing both the I and Q oscillator signals to be applied to the I and Q paths respectively, of the multistage frequency-converting means. So separate 90° phase shifters are no longer necessary in the coupling or direct connection between the generally local oscillator and, in particular, the Q paths' oscillator inputs of the multistage frequency-converting means.

BRIEF DESCRIPTION OF THE DRAWINGS

These and other aspects and advantages of the present invention will be apparent from and further elucidated with reference to the embodiments and figures described hereinafter. Similar elements in the separate figures are provided with the same reference numerals. In the drawing.

DETAILED DESCRIPTION OF THE PREFERRED EMBODIMENT

Figure 1:
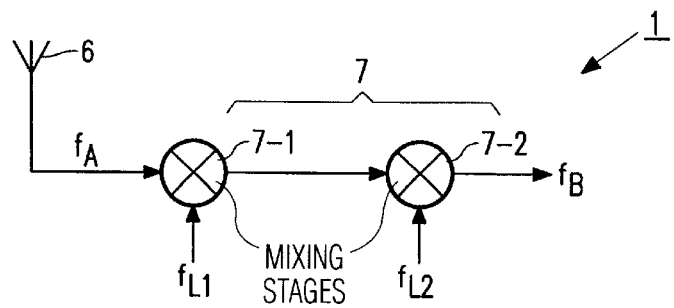
FIG. 1 shows a principle scheme of one embodiment of the frequency-conversion circuit according to the present invention.
Figure 7:
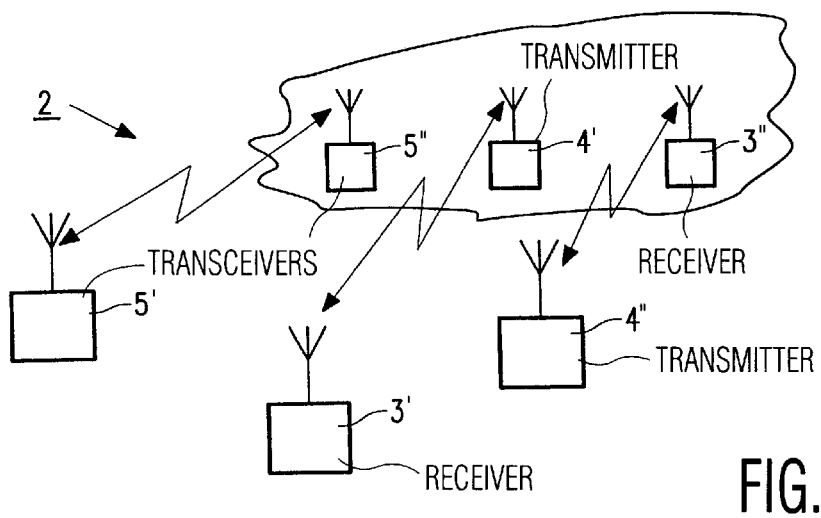
FIG. 7 schematically shows a telecommunication system comprising transmitters and/or receivers having one or more frequency-conversion circuits according to the invention.
Figure 8:
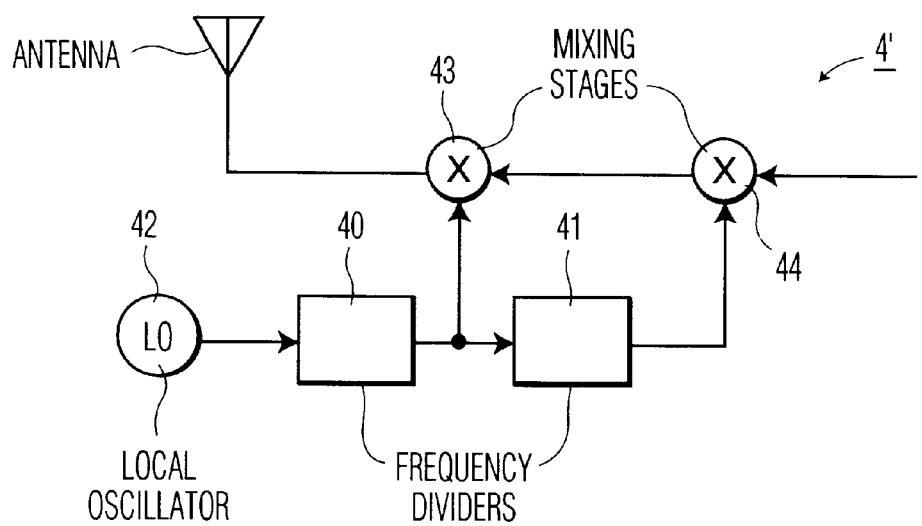
FIG. 8 shows a transmitter with a frequency-divider series arrangement coupled to mixing stages.
Figure 9:
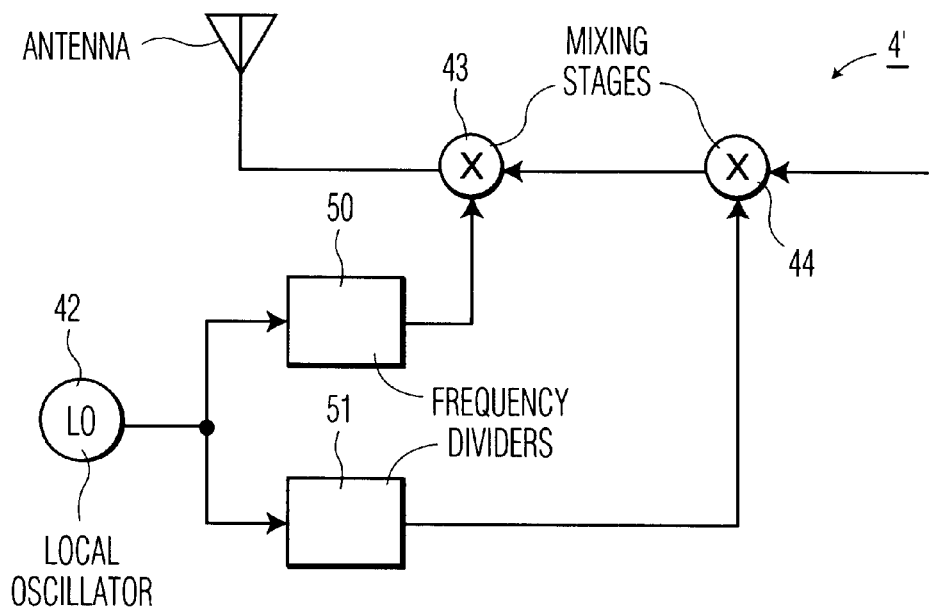
FIG. 9 shows a transmitter with a frequency-divider parellel arrangement coupled to mixing stages.

FIG. 1 shows a frequency-conversion circuit 1 that can be used in a telecommunication system 2 as schematically shown in FIG. 7. The telecommunication system 2 shown comprises one or more receivers 3' and 3", transmitters 4' and 4", and/or transceivers (=transmitter/receiver) 5, each of which contains apart from other circuits, the frequency-conversion circuit 1. The telecommunication system can be a transmission system, such as a radio transmission system, a cordless or cellular telephone system or the like, an audio- or video system, a control system, a telemetry system, a local area network, a wide area network etcetera. Such a frequency-conversion circuit 1 can be used for frequency up conversion or frequency down conversion dependent on the application in a transmitter 4 or receiver 3, respectively.

Figure 2:
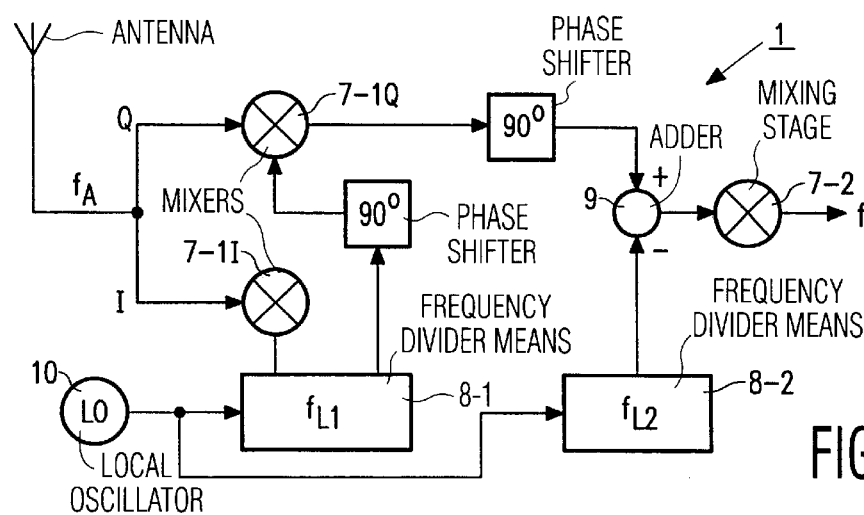
FIG. 2 shows an elaborate worked out embodiment of one stage of a multistage frequency-converting means, and a second stage thereof for application in the frequency-conversion circuit of FIG. 1.
Figure 3:
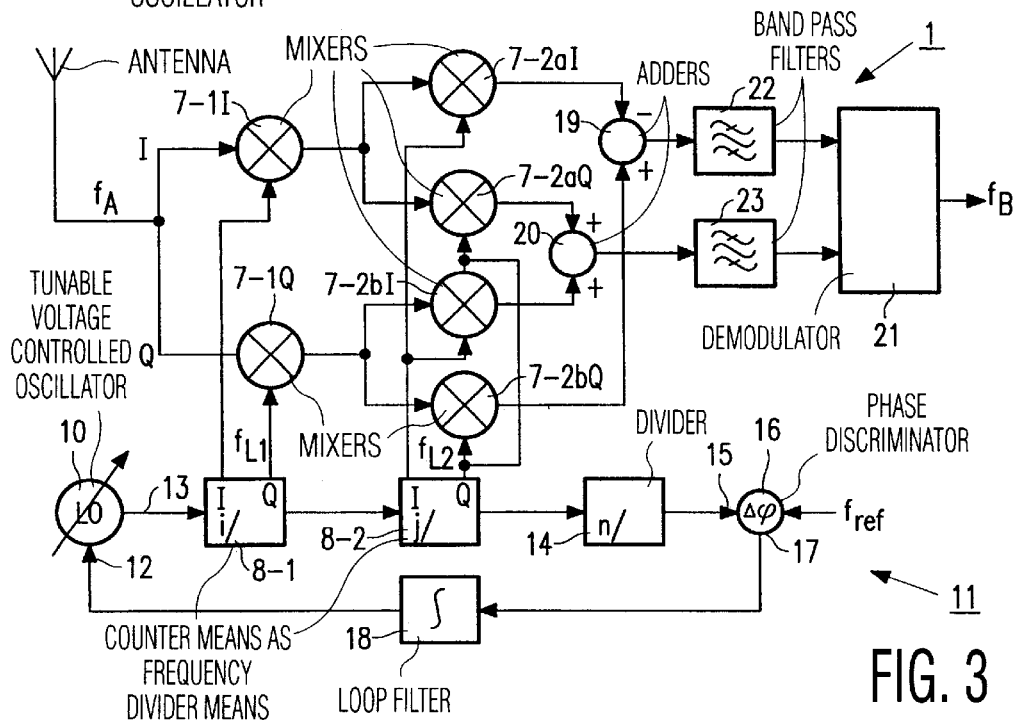
FIG. 3 shows another embodiment of the frequency-conversion circuit according to the invention.

For the sake of simplification of the description, FIGS. 1–3 relate to frequency-conversion circuits 1 used in the receiver 3', although the frequency-conversion circuits 1 could equally well be used in the transmitter 4' or the transceiver 5'.

The frequency-conversion circuit 1 comprises an antenna 6 connected to a multistage frequency-converting means 7 showing two conversion stages or mixing stages 7-1 and 7-2 having oscillator inputs referred to in this figure as $f_{L1}$ and $f_{L2}$. The multistage frequency-converting means 7 could include more than two stages although nowadays this is quite uncommon. The antenna signal $f_A$ is mixed in stage 7-1 with a first local oscillator signal $f_{L1}$ and the resulting mixed signal is then mixed in stage 7-2 with a second local oscillator signal $f_{L2}$ to reveal a baseband signal $f_B$ after demodulation (not shown in FIGS. 1 and 2). For zero-IF $f_A = f_{L1} + f_{L2}$.

In FIG. 2, the stage 7-1 shows in greater detail a quadrature down conversion in an I-path and a Q-path. The I- and Q paths comprise a mixer 7-1I and 7-1Q, respectively, whereto I and Q local oscillator signals $f_{L1}$ are applied from a frequency divider means 8-1 to be described hereafter. Appropriate 90° phase shifters are provided, as indicated, and the I and Q path signals are subtracted from each other in adder 9 to reveal an intermediate signal to be mixed in stage 7-2 with the second local oscillator signal $f_{L2}$ provided by a frequency divider means 8-2, to be described hereafter, resulting in the baseband signal $f_B$. A local oscillator 10 is coupled to inputs of the multistage frequency converting means 7-1 and 7-2, respectively, as shown in FIG. 3, that is to say connected through the series arrangement of both frequency divider means 8-1 and 8-2, or as shown in FIG. 2, connected through the parallel arrangement of both frequency divider means 8-1 and 8-2.

FIG. 3 shows a detailed embodiment of how the frequency divider means 8-1, 8-2 are included in only one phase-locked loop 11. The phase-locked loop 11 further comprises the local oscillator in the form of a generally tunable voltage-controlled oscillator 10 having a control input 12 and an oscillator output 13 coupled to the frequency divider means 8-1, which is connected in series to the frequency divider means 8-2 and a further divider 14, which is connected to an input 15 of a phase discriminator 16. The phase discriminator 16 has a reference frequency input for inputting a reference signal $f_{REF}$, such as a signal from a conventional crystal oscillator (not shown) and an output 17 coupled to the control input 12 of the voltage controlled oscillator 10 through a loop filter 18 for a stable control of the PLL. The further divider 14 has a divisorn that, in dependence on respective divisors i and j of the frequency divider means, matches the local oscillator frequency to the frequency of $f_{REF}$. In the case shown here, the frequency divider means comprises counter means 8-1, 8-2. These counter means easily provide the I and Q oscillator signals for both $f_{L1}$ and $f_{L2}$ signals. Embodiments thereof will be presented in FIGS. 4–6.

FIG. 3 further shows details of mixing stage 7-2, which is divided in a first pair of branches, which are connected to mixer 7-1I and which comprise mixers 7-2aI and 7-2aQ, which are connected with minus and plus signs to adders 19 and 20, respectively, and in a second pair of branches, connected to mixer 7-1Q and which comprise mixers 7-2bI and 7-2bQ, which are connected both with plus signs to the adders 19 and 20, respectively. Quadrature output signals of the adders 19 and 20 are led to a demodulator 21 through bandpass filters 22 and 23, respectively, revealing the actual baseband signal $f_B$. For zero-IF, these filters 22 and 23 can be embodied as low-pass filters.

The operation of the frequency-conversion circuit 1 of FIG. 3 will now be described for the case wherein the counter means 8-1, 8-2 are simple binary counters which divide the input-signal frequency by 2. Assuming $f_A$=900 MHz, a local oscillator frequency of 1200 MHz, will lead to a value of $f_{L1}$=1200/2=600 MHz. Consequently, $f_{L2}$=600/2= 300 MHz and the output signal after the second stage 7-2 will lie in the baseband. Tuning can be achieved by stepping of the local oscillator 10 at ⅔ times the channel spacing steps. Moreover, because in this example the local oscillator frequency does not coninicide with the RF-antenna frequency, also crosstalk problems are significantly reduced. In addition, an excellent image suppression is achieved in a way which is easy to integrate on a chip, and which does not require external components or, in the case of zero-IF, filters that are very difficult or impossible integrate, such as polyphase filters, multimixer filters, sequence asymmetric filters and the like.

If, in general, in the series arrangement of counters, the first counter means 8-1 has divisor i and the second counter means 8-2 has divisor j, than the equation for zero-IF is:

$$f_{LO} = f_A \cdot i \cdot j/(j+1)$$

Figure 4:
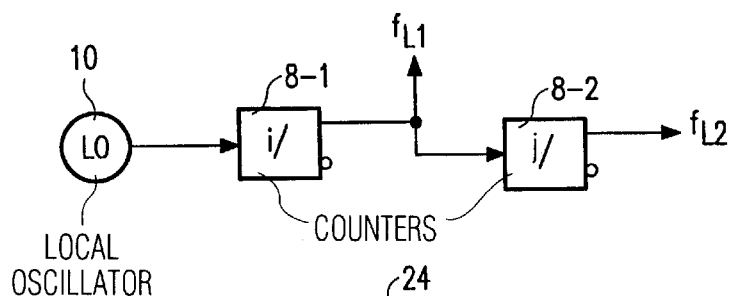
FIG. 4 shows a frequency divider means comprising a series arrangement of counters for application in the frequency-conversion circuit according to the invention.
Figure 5:
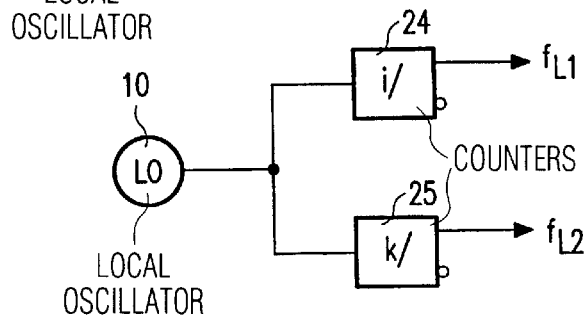
FIG. 5 shows a frequency divider means comprising a parallel arrangement of counters for application in the frequency-conversion circuit according to the invention.
Figure 6:
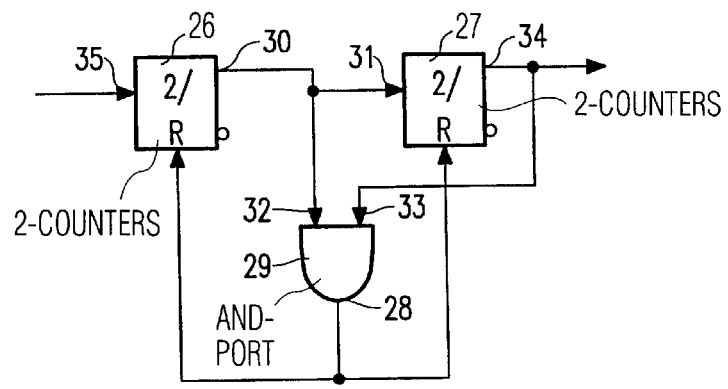
FIG. 6 shows a frequency divided by 3 means for application in the frequency divider means of FIGS. 4 or 5.

FIG. 4 shows a simple way of connecting two 2-counters 8-1 and 8-2 that will generally be included in a phase-locked loop as shown in FIG. 3. By virtue thereof, an easily integratable fixed phase relation between the I- and Q-outputs is achieved, which reduces problems that emanate from a varying phase. FIG. 5 shows an embodiment of counters 24 and 25 in a possible parallel arrangement. Apart from divisors i and k which are equal to 2, also divisors having a different value could be implemented, if necessary. An embodiment of a counter means, such as 8-2, embodied as a 3-counter is shown in FIG. 6, the 3-counter being built up from easy to integrate 2-counters 26 and 27 having reset inputs R jointly connected to an output 28 of a gate means formed as an AND-port 29. An output 30 of the counter 26, and an input 31 of the counter 27 are jointly connected to a first input 32 of the AND-port 29, whose second input 33 is connected to output 34 of the counter 27 for outputting a signal whose frequency is divided by 3 relative to the signal on input 35 of the counter 26.

What is claimed is:

1. A multistage low-IF receiver which can be readily integrated, comprising:

a first frequency down conversion stage comprising a first mixer, said first mixer being configured to down-convert a radio frequency signal having a carrier frequency $f_A$ received by said receiver to a first lower frequency signal, a second frequency down conversion stage comprising a second mixer, said second mixer being configured to down-convert said first lower frequency signal to a second lower frequency signal in or close to the baseband of the receiver, a single local oscillator, said oscillator having a frequency $f_{LO}$ that is higher than $f_A$, a first frequency divider that is directly connected between an output of said oscillator and an input of said first mixer, and a second frequency divider that is coupled between said oscillator and an input of said second mixer, said receiver having a single phase locked loop, said phase locked loop including said oscillator and at least one of said first and second frequency dividers.

2. A receiver as claimed in claim 1, wherein said first and second frequency dividers are connected in series, said second frequency divider being directly connected between an output of said first frequency divider and said input of said second mixer.

3. A receiver as claimed in claim 1, wherein said first and second frequency dividers are connected in parallel, said second frequency divider being directly connected between said output of said oscillator and said input of said second mixer.

4. A receiver as claimed in claim 1, wherein the first frequency divider comprises a first counter, and the second frequency divider comprises a second counter.

5. A receiver as claimed in claim 4, wherein said first and second counters are two-counters.

6. A receiver as claimed in claim 1, wherein said first mixer is a quadrature mixer.

7. A receiver as claimed in claim 6, wherein said second mixer is a double quadrature mixer with a first quadrature mixer in an in-phase path of said quadrature mixer, and with a second quadrature mixer in a quadrature path of said quadrature mixer.

8. A receiver as claimed in claim 1, wherein said oscillator, said first frequency divider, and said second frequency divider are connected in series in said phase locked loop.

9. A receiver as claimed in claim 8, wherein said phase locked loop further comprises a third frequency divider, a phase discriminator, and a loop filter, and said oscillator is a voltage controlled oscillator, said third frequency divider being coupled between said second frequency divider and said phase discriminator, and said loop filter being coupled between said phase discriminator and a control input of said voltage controlled oscillator.

10. A receiver as claimed in claim 9, wherein said phase discriminator has a reference input for a frequency reference signal.

11. A receiver as claimed in claim 1, wherein said receiver is a zero-IF receiver and said second lower frequency signal is in the baseband of the receiver.

12. A receiver as claimed in claim 11, wherein said oscillator has a frequency approximately ⅔ times the carrier frequency $f_A$ and said first and second frequency dividers are both two-counters.

13. A receiver as claimed in claim 1, wherein the first frequency divider divides by i, the second frequency divider divides by j, and $f_{LO}=f_A \cdot i \cdot j/(j+1)$.

* * * * *